United States Patent
Mellot (10) Patent No.: US 6,680,680 B1
(45) Date of Patent: Jan. 20, 2004

(54) PROCESS AND DEVICE FOR CONVERTING AN ANALOG SIGNAL INTO A DIGITAL SIGNAL WITH AUTOMATIC GAIN CONTROL

(75) Inventor: Pascal Mellot, Lans en Vercors (FR)

(73) Assignee: STMicroelectronics S.A., Gentilly (FR)

( * ) Notice: Subject to any disclaimer, the term of this patent is extended or adjusted under 35 U.S.C. 154(b) by 502 days.

(21) Appl. No.: 09/629,296

(22) Filed: Jul. 28, 2000

(30) Foreign Application Priority Data

Aug. 16, 1999 (FR) ............................................ 99 10523

(51) Int. Cl.$^7$ ................................................ H03M 3/00
(52) U.S. Cl. ........................ 341/143; 341/144; 341/155; 341/172
(58) Field of Search ................................ 341/143, 144, 341/155, 172, 120, 139; 375/350, 242, 105

(56) References Cited

U.S. PATENT DOCUMENTS

| | | | | |
|---|---|---|---|---|
| 5,541,600 A | * | 7/1996 | Blumenkrantz et al. | 341/139 |
| 5,940,019 A | | 8/1999 | Maejima | 341/143 |
| 5,982,315 A | * | 11/1999 | Bazarjami et al. | 341/143 |
| 5,995,036 A | * | 11/1999 | Nise et al. | 341/172 |
| 6,148,048 A | * | 11/2000 | Kerth et al. | 341/139 |
| 6,160,859 A | * | 12/2000 | Martin et al. | 341/143 |
| 6,225,928 B1 | * | 5/2001 | Green | 341/143 |
| 6,278,750 B1 | * | 8/2001 | Yu | 341/143 |
| 6,317,068 B1 | * | 11/2001 | Gattani et al. | 341/172 |
| 6,393,070 B1 | * | 5/2002 | Reber | 341/157 |
| 6,456,219 B1 | * | 9/2002 | Schreiber et al. | 341/143 |
| 6,498,819 B1 | * | 12/2002 | Martin | 341/143 |
| 6,577,258 B2 | * | 6/2003 | Ruha et al. | 341/143 |
| 6,587,060 B1 | * | 7/2003 | Abbey | 341/143 |

FOREIGN PATENT DOCUMENTS

| | | | |
|---|---|---|---|
| EP | 0607711 | 7/1994 | G01R/21/133 |
| JP | 10247852 | 9/1998 | |

OTHER PUBLICATIONS

*A/D converter uses sigma–delta modulation to resolve 16 bits at 100kHz*, EDN Electrical Design News, US, Cahners Publishing Co., Newton, MA, vol. 34, No. 11, May 25, 1989, p. 109–110.

* cited by examiner

*Primary Examiner*—Michael Tokar
*Assistant Examiner*—Lam T. Mai
(74) *Attorney, Agent, or Firm*—Allen, Dyer, Doppelt, Milbrath & Gilchrist, P.A.; Lisa K. Jorgenson

(57) ABSTRACT

A method for converting an analog signal into a digital signal with automatic gain control includes inputting an analog signal into an analog-to-digital converter of a delta-sigma type having an output sampling frequency. The automatic gain control is performed in the analog-to-digital converter downstream of a delta-sigma modulator on an intermediate digital signal sampled at an intermediate sampling frequency greater than an output sampling frequency.

23 Claims, 7 Drawing Sheets

PROCESS AND DEVICE FOR CONVERTING AN ANALOG SIGNAL INTO A DIGITAL SIGNAL WITH AUTOMATIC GAIN CONTROL

FIELD OF THE INVENTION

The present invention relates to the field of electronics, and, more particularly, to analog-to-digital converters and related methods.

BACKGROUND OF THE INVENTION

Figure 1:
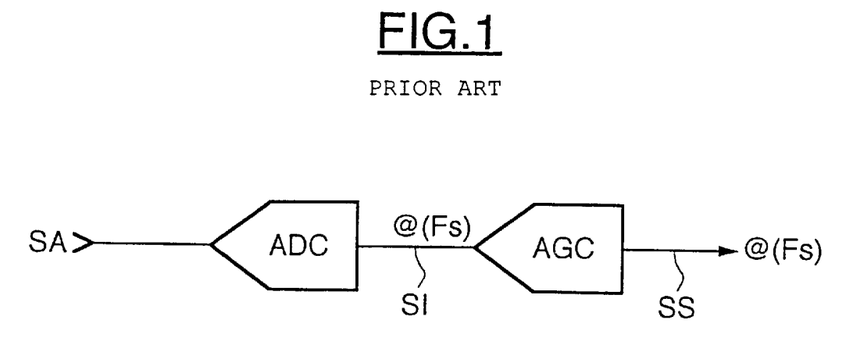
FIGS. 1 and 2 (already described) are schematic diagrams illustrating a device for analog-to-digital conversion with automatic gain control according to the prior art.

The present invention relates to speech processing and voice transmission, for example, during video-conferencing sessions. FIG. 1 diagrammatically illustrates a prior art device for converting an analog signal into a digital signal with automatic gain control. This device includes an analog-to-digital converter ADC receiving at its input the analog signal SA and delivering at its output a digital signal SI sampled at the output sampling frequency Fs. The samples @ of the digital signal SI are delivered successively to an automatic gain control AGC which outputs a digital signal SS. The samples @ of the digital signal SS have an amplitude equal to the product of the amplitude of the input samples multiplied by a gain.

Figure 2:
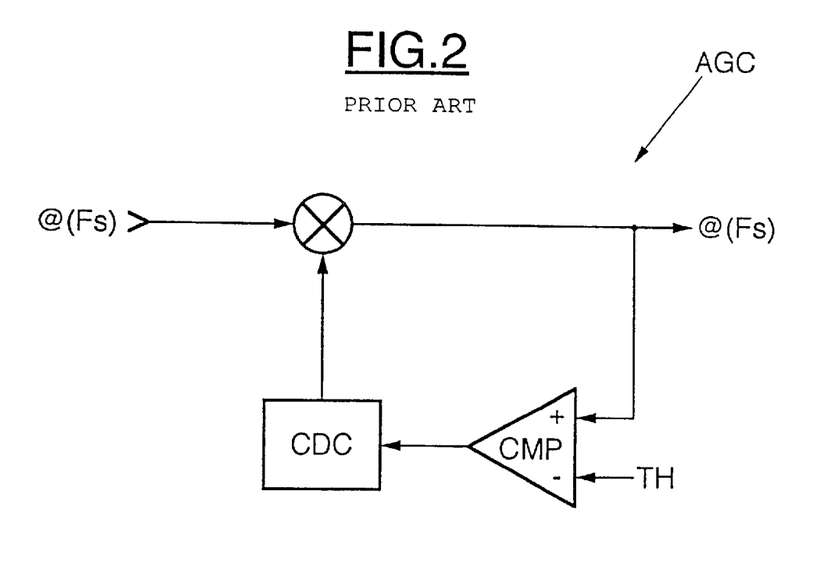

When the amplitude of the analog signal SA increases, and consequently the amplitude of the digital signal SI (i.e., the level of the samples), the automatic gain control AGC will then adjust the value of the gain to restore at its output samples whose levels are equal to the level of the samples before the amplitude jump. FIG. 2 diagrammatically illustrates such an automatic gain control AGC of the prior art which includes a multiplier receiving the samples of the digital signal SI from the converter ADC at the sampling frequency Fs. Furthermore, the multiplier receives the output of a up/down counter CDC whose input is connected to the output of the multiplier by a comparator CMP. The other input of the comparator CMP receives a fixed but programmable threshold TH.

During operation, when the level of the output sample is greater than the threshold TH, the value of the up/down counter CDC (i.e., the value of the gain) decreases at each stage at the working frequency of the up/down counter CDC. The working frequency is much greater than the sampling frequency Fs. On the other hand, if the level of the output sample is below the threshold TH, the value of the up/down counter will increase at each stage.

In response to an abrupt increase in the amplitude level of the analog signal, it is generally required that the amplitude of the digital signal SS delivered by the automatic gain control AGC be returned to its initial value after a predetermined duration Tatt, which varies according to the application. Obtaining the specified value for the duration Tatt is achieved by modulating the duration of operation of the up/down counter within each sampling period Ts.

Figure 3:
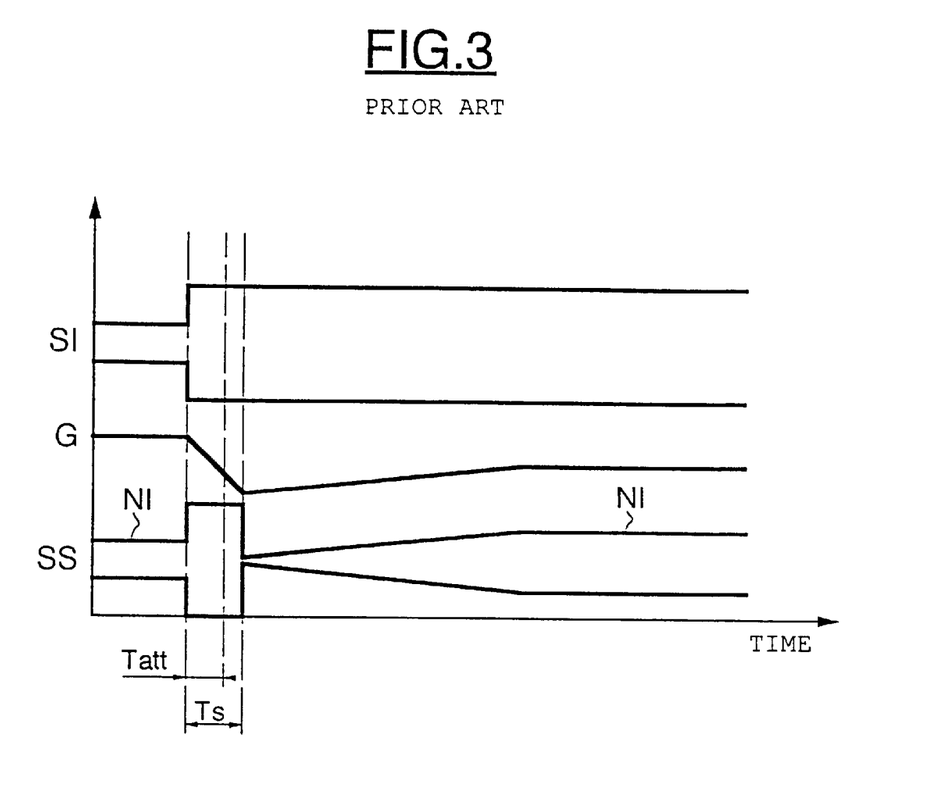
FIG. 3 is a graph illustrating a mode of operation of the prior art device of FIGS. 1 and 2.

Depending on the application, the duration Tatt may be short and less than the sampling period Ts corresponding to the sampling frequency Fs. In this case, the automatic gain control AGC will correct the gain several times during the sampling period Ts. Furthermore, during this sampling period the level of the input sample (and consequently the level of the output sample present on the + input of the comparator) will be constant. As a result, convergence of the automatic gain control AGC is not possible. Stated alternatively, the automatic gain control AGC can no longer react properly, as illustrated in FIG. 3.

In the course of the sampling period Ts, at the start of which the digital signal SI delivered by the converter ADC has undergone an amplitude pulse, the level of the output signal SS from the automatic gain control AGC also undergoes an amplitude pulse and then remains constant. During this period, the gain G decreases continuously. Also, when at the start of the next sampling period the next sample of the signal SI is delivered to the input of the automatic gain control AGC, the level of the signal SS drops precipitously below the initial level NI before gradually rising back to the initial level NI in the course of the succeeding sampling periods. This produces a pumping effect on the gain, which in speech processing applications results in audible oscillations.

SUMMARY OF THE INVENTION

In view of the foregoing background, it is therefore an object of the present invention to provide a method for converting an analog signal into a digital signal with automatic gain control which overcomes the above problem.

According to the invention, a method for converting an analog signal into a digital signal with automatic gain control includes inputting the analog signal into an analog-to-digital converter of a delta-sigma type having an output sampling frequency. The automatic gain control is performed in the converter downstream of the delta-sigma modulator of the analog-to-digital converter on an intermediate digital signal sampled at an intermediate sampling frequency greater than the output sampling frequency.

Stated alternatively, the invention provides in combination an analog-to-digital converter of a delta-sigma type to perform the analog digital conversion and an automatic gain control in the same converter. This is accomplished by using the digital signals oversampled with respect to the output sampling frequency provided by the delta-sigma converter. Thus, by performing the automatic gain control on intermediate samples delivered at an intermediate sampling frequency higher than the output sampling frequency, it is possible to obtain low durations Tatt which are less than the sampling period of the digital signal obtained (where the sampling period corresponds to the output sampling frequency of the converter) while avoiding the pumping effect of the prior art.

The automatic gain control may be performed at any point downstream of the delta-sigma modulator, particularly at the output of the analog-to-digital delta-sigma modulator. Yet, to obtain improved accuracy it is preferable to perform the automatic gain control on intermediate samples having a relatively large number of bits, providing better resolution. Accordingly, it is advantageous to perform the automatic gain control on the samples of the intermediate signal which are delivered by a comb decimator filter connected to the output of the delta-sigma modulator.

In certain applications, it is necessary to perform a phase of prior calibration of the converter to account for the shift or offset introduced by the delta-sigma modulator. When such a phase of prior calibration is necessary, the invention provides in one embodiment for a constant analog calibration signal to be input into the converter, and for a digital calibration word to be formulated at a location of the converter (the "calibration location") based upon the digital samples delivered at the calibration location. The calibration location is situated between the modulator and the location where the automatic gain control is performed. Once this calibration phase has been performed, the digital calibration word is subtracted from each sample delivered to the calibration location and emanating from the analog input signal to be converted. Intermediate digital samples are thereby formed on which the automatic gain control is performed.

In other words, the calibration offset is calculated at a location upstream of the automatic gain control rather than downstream so that the calculation is performed independently of the gain values which may be taken by the automatic gain control. Again, the calibration location may be situated directly at the output of the delta-sigma modulator. Even so, greater accuracy in the calibration offset (digital calibration word) may be obtained by situating the calibration location at the output of the comb decimator filter. During the calibration phase, the formulation of the digital calibration word may include a low-pass filtering of the digital samples delivered to the calibration location. Indeed, this makes it possible to perform rejection of certain noise frequencies which might otherwise disturb the calibration phase.

According to the invention, a device is for analog-to-digital conversion with automatic gain control including an analog-to-digital converter of a delta-sigma type. The analog-to-digital converter includes a delta-sigma modulator, an output decimator filter, and an automatic gain control connected between the modulator and the output decimator filter. The converter may also include a comb decimator filter arranged between the modulator and the output decimator filter. The automatic gain control may then advantageously be arranged between the comb filter and the output decimator filter.

When a calibration is required, the device may include a calibration means or calibrator including a multiplexer having an input connected to the output of the comb decimator filter and first and second outputs. A subtraction means or subtractor is also included having a first input connected to the first output of the multiplexer, a second input, and an output connected to the input of the automatic gain control. Additionally, a memory means or memory (for example, a register) connected between the second output of the multiplexer and the second input of the subtraction means is included. Furthermore, a drive means or driver is included to connect the input of the multiplexer to its second output during a calibration phase to store in the memory means a digital calibration word in response to a constant analog calibration signal present at the input of the converter. The drive means also connects the input of the multiplexer to its first output in a phase of normal operation of the converter.

The calibration means may comprise a low-pass filter connected to the memory means during the calibration phase. The low-pass filter includes, in one embodiment, at least one means or shifter for shifting bits leftward connected between the output of the memory means and the input of the memory means by an adder, and an additional means or shifter for shifting bits leftward connected between the second output of the multiplexer and the adder.

BRIEF DESCRIPTION OF THE DRAWINGS

Other advantages and characteristics of the invention will become apparent upon examining the following detailed description of the present invention and the appended drawings, in which.

DETAILED DESCRIPTION OF THE PREFERRED EMBODIMENTS

Figure 4:
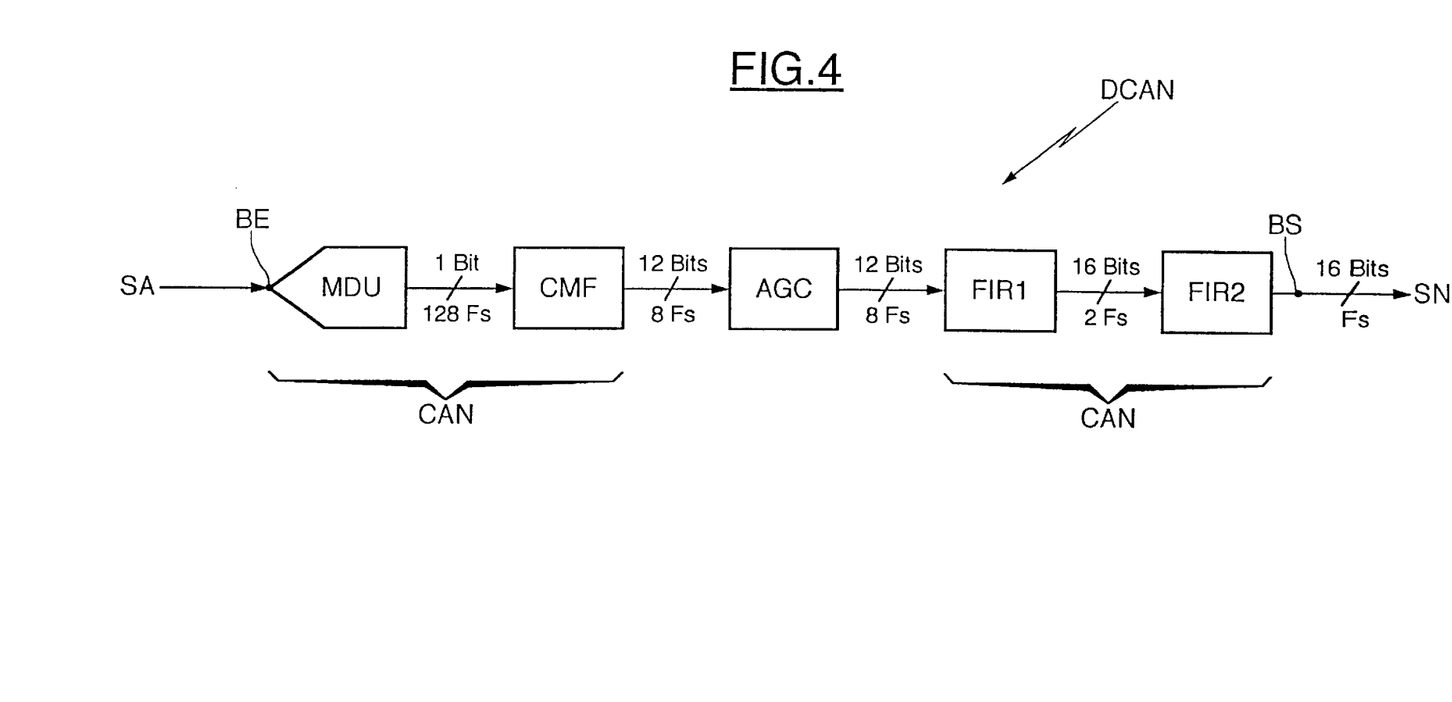
FIG. 4 is a schematic diagram illustrating the internal architecture of an analog-to-digital conversion device according to the invention.

Referring now to FIG. 4, the reference DCAN designates a device for analog-to-digital conversion with automatic gain control according to the invention. The device DCAN includes an analog-to-digital converter CAN of a delta-sigma type and an automatic gain control AGC. The structure of an analog-to-digital converter of the delta-sigma type is conventional and known to the those of ordinary skill in the art. The principal characteristics thereof will be discussed below, although a more detailed description may be found in "Delta-Sigma Data Converters Theory, Designs and Simulation" by Steven R. Northworthy, Richard Schreier, and Gabor C. Temes, published by IEEE Press (Piscataway, USA).

The structure of an automatic gain control is also conventional and known to those of skill in the art. The role of the analog-to-digital converter of the delta-sigma type is to sample an analog input signal SA and convert it into a digital output signal SN at a predetermined sampling frequency Fs (the "output sampling,frequency"). The delta-sigma converter includes at one end a modulator MDU of a delta-sigma type and at its output at least one output decimator filter. The decimator filter or filters may be finite impulse response filters, for example.

The present invention not only uses an analog converter of the delta-sigma type to perform the analog-to-digital conversion, but it also incorporates the automatic gain control AGC into the actual interior of the analog-to-digital converter; that is, between the modulator of delta-sigma type and the output decimator filter. The present invention performs the automatic gain control on an oversampled digital signal, that is, one having an intermediate sampling frequency which is greater than the output sampling frequency of the digital output signal.

As illustrated in FIG. 4, the input terminal BE of the device DCAN is also the input terminal of the delta-sigma modulator MDU. In the example described, the modulator MDU outputs a one-bit sampled signal, where the sampling frequency is equal to 128 times the output sampling frequency. The successive 1 bit samples are delivered to a comb decimator filter CMF of a conventional structure which outputs intermediate 12 bit digital samples at an intermediate sampling frequency equal to 8 times the output sampling frequency Fs. The automatic gain control will be performed on the samples of this oversampled intermediate signal.

The automatic gain control AGC therefore delivers an output signal which is also sampled at the frequency 8Fs and formed of 12-bit samples. These samples are then processed in a first decimator filter FIR1 which outputs 16-bit samples at the sampling frequency 2Fs. After passing through a second finite impulse response decimator filter FIR2, the output samples (each 16 bits) are delivered in succession to the output terminal BS of the device DCAN at the sampling frequency Fs and form the digital output signal SN.

Figure 5:
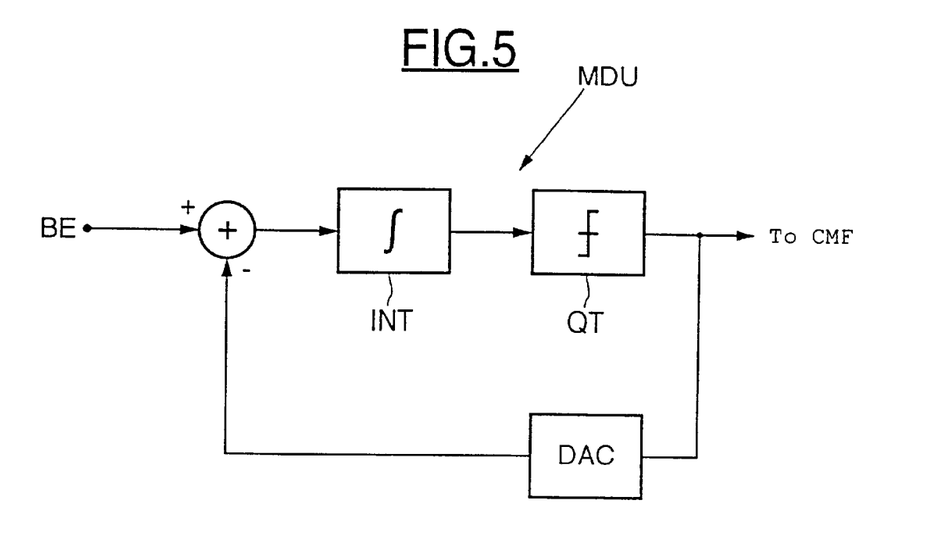
FIG. 5 is a schematic diagram of the internal architecture of the delta-sigma modulator of the device of FIG. 4.

Turning now to FIG. 5, the modulator MDU includes at the one end a subtractor linked to the input terminal BE. The subtractor is followed by an integrator INT and by a quantizer QT whose output provides the output of the modulator MDU. The output of the quantizer QT is connected to the subtractor via a digital-to-analog converter DAC. "Delta" modulation is based on quantizing the modification of the signal sample-by-sample, rather than on quantizing the absolute value of the signal at each sample. The presence of the integrator INT (sigma) in the modulator MDU results in its being referred to as a "delta-sigma" modulator.

The output from the delta-sigma modulator MDU is at a very high sampling frequency. This is a fundamental characteristic of delta-sigma modulators since they use the high frequency portion of the spectrum to place the major part of the quantization noise. Indeed, a delta-sigma modulator is designed to suppress the quantization noise in the baseband. The reduction in the output sampling frequency of the delta-sigma modulator is then carried out in a decimator filter for eliminating most of the quantization noise outside the baseband and leaving only a small portion of the quantization noise in the baseband (which amounts to increasing the effective resolution of the output). The decimator filter also performs a decimation, i.e., a reduction of the sampling frequency.

Figure 6:
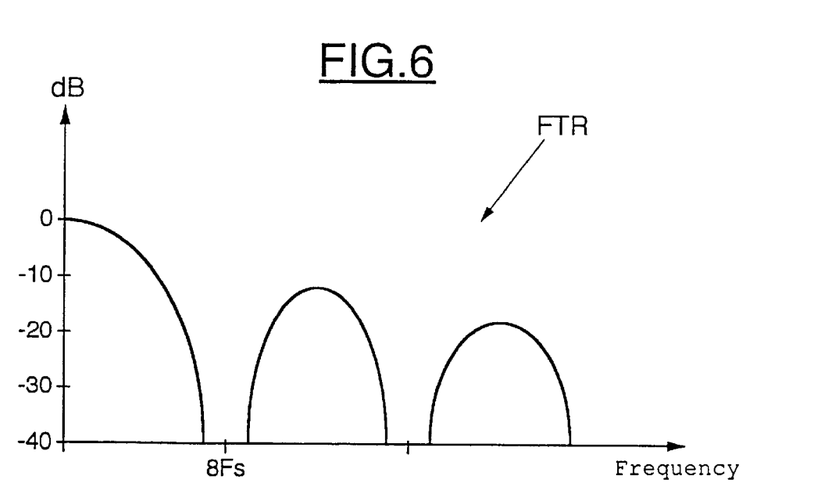
FIG. 6 is a graph illustrating the transfer function of a comb decimator filter of the converter of FIG. 4.

One way to perform these functions is to use a finite impulse response decimator filter. Yet, the most economical and simplest way of reducing the sampling frequency at the output of the delta-sigma modulator is to use a comb decimator filter, whose structure is known to those of ordinary skill in the art. The comb filter is a filter with finite impulse response whose coefficients are all equal to 1 and which behaves like a simple accumulator performing a sliding average. The transfer function FTR of such a comb filter, for example of order 1, is illustrated diagrammatically in FIG. 6. The use of a comb decimator filter is advantageous because it avoids the need for a multiplier or storage for the coefficients of the filter.

Figure 7:
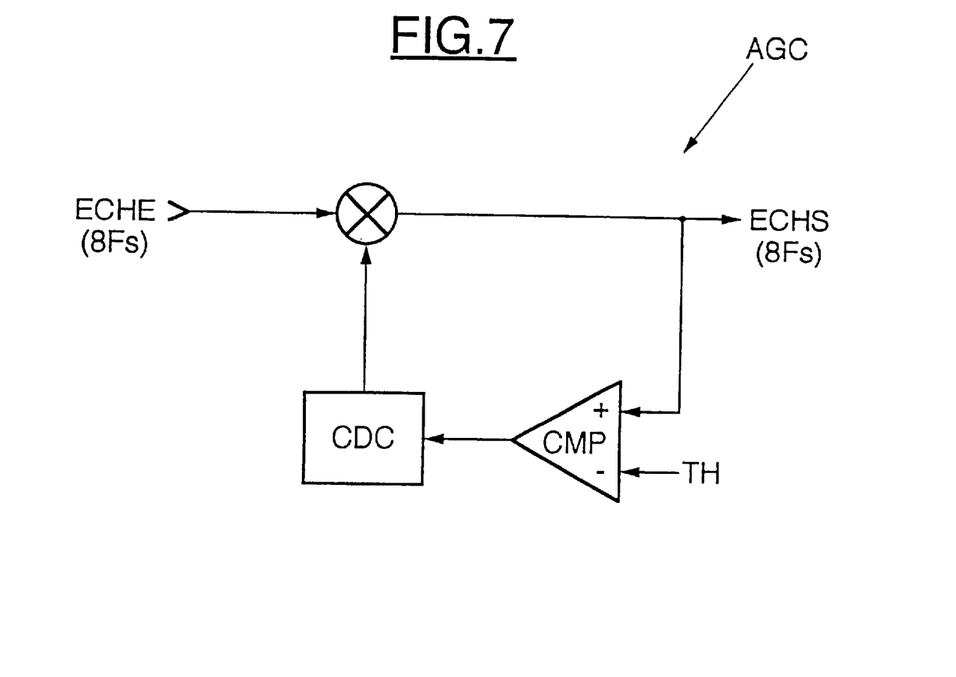
FIG. 7 is a schematic diagram of the internal architecture of an automatic gain control according to the invention.

At the output of the comb filter the intermediate digital signal is formed of 12-bit samples delivered in succession at the intermediate sampling frequency equal to 8 times the output sampling frequency Fs. The samples ECHE of this intermediate signal are then delivered into the automatic gain control AGC (FIG. 7), which outputs samples ECHS (also at the frequency 8Fs). Each sample ECHS is equal to the product of the corresponding input sample ECHE multiplied by the gain provided by the up/down counter CDC. The structure and the manner of operation of the automatic gain control AGC are identical to those which have been described with reference to FIG. 2, with the exception that the automatic gain control AGC operates on an intermediate signal which is oversampled with respect to the digital output signal. It would be possible, in certain applications where accuracy is not critical, to perform the automatic gain control directly at the output of the delta-sigma modulator on 1-bit samples. Even so, for applications where accuracy is important, it is preferable to perform this automatic gain control on samples having a greater resolution. This is why the automatic gain control is performed preferably at the output of the comb filter CMF.

The automatic gain control AGC is followed by an output stage of a delta-sigma converter which includes at least one output decimator filters which is conventionally a finite impulse response low-pass filter. In the example described, the output stage of the converter of FIG. 4 includes a first output decimator filter FIR1 which reduces the sampling frequency to 2Fs while increasing the resolution to 16 bits. The second output decimator filter FIR2 again reduces the sampling frequency to obtain the output sampling frequency Fs while maintaining the output resolution of 16 bits.

Figure 8:
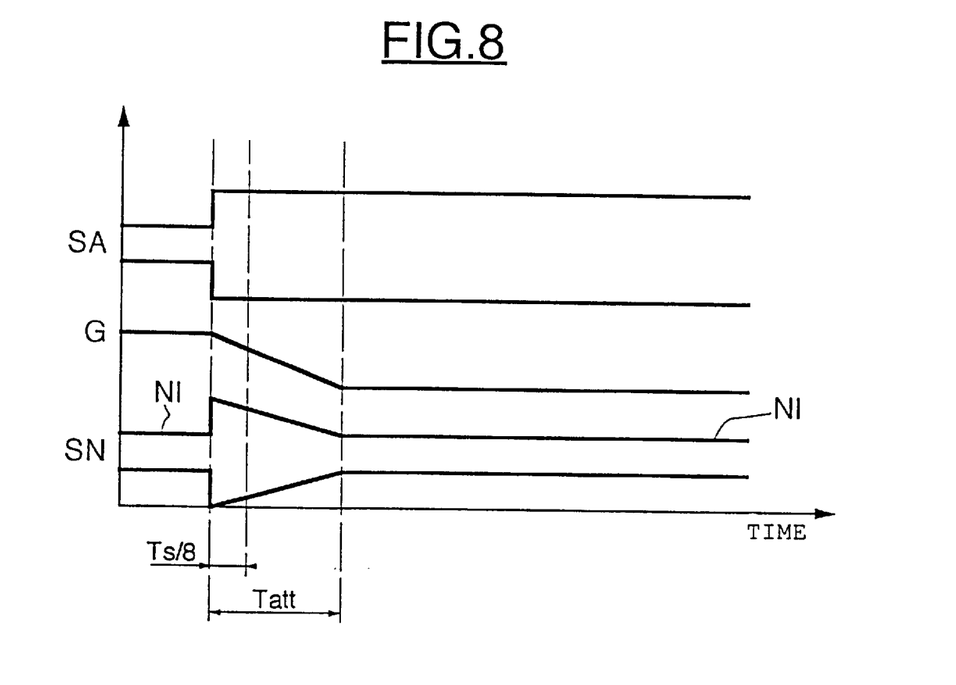
FIG. 8 is a graph illustrating a mode of operation of a converter according to the invention.

Referring now to FIG. 8, the operation of a device according to the invention where an amplitude pulse occurs on the analog input signal SA is now described. By working on an oversampled signal it is possible, by altering the duration of operation of the up/down counter within each oversampling period Ts/8, to obtain small variations in gain and to obtain a slow and linear variation in the gain during the entire period Tatt. As a result, recovery of the initial level NI of the digital signal SN is possible without any pumping effect or audible oscillation. That is, the invention makes it possible to construct, in a simple manner and with little or no additional cost, a device for analog-to-digital conversion which can support a drive duration Tatt equal to a multiple of the allowable drive duration for a prior art device, in this instance 8 times greater in the particular example just described.

Of course, in the example just described the duration Tatt will nevertheless have to remain greater than Ts/8 to avoid the undesirable effects of oscillation and pumping. In certain applications, it is necessary to calibrate the analog-to-digital conversion device according to the invention. In such cases, the device of the present invention may include calibration means MCAL such as those illustrated diagrammatically in FIGS. 9 and 10. In these figures, the elements similar to those represented in FIG. 4 have the same references as those marked in FIG. 4. For convenience, only the differences between FIGS. 9 and 10 and FIG. 4 will be described.

Figure 9:
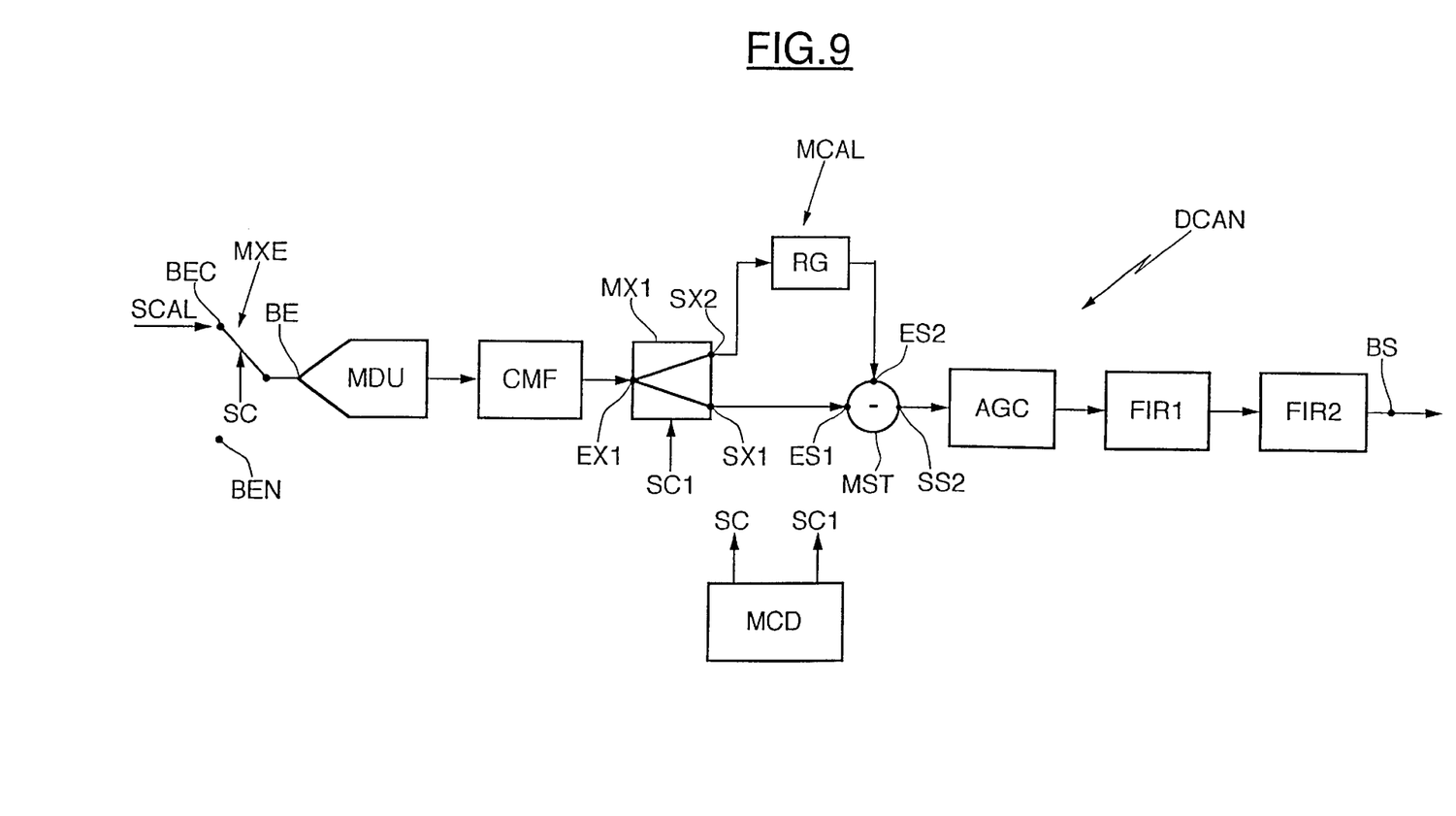
FIG. 9 is a schematic diagram of another embodiment of a converter according to the invention, including a calibration means.

The calibration of the device includes calibrating the delta-sigma modulator MDU by determining the DC offset voltage of the analog part of the modulator MDU. In this regard, during the calibration phase a calibration signal SCAL, which in this instance is a constant analog voltage (for example, the value 0 or the value Vcc/2 if Vcc denotes the supply voltage of the device), is input into the device DCAN. A digital word (the so-called "calibration word") is then determined in relation to the analog-to-digital conversion of the calibration signal SCAL. This calibration word will then be subtracted, during normal operation, from the digital signal resulting from the conversion of an analog signal to be converted.

The presence of the automatic gain control AGC within the delta-sigma converter requires that the location where the digital calibration word will be determined (the so-called "calibration location") he suitably chosen. The calibration location may be situated between the output of the delta-sigma modulator MDU and the input of the automatic gain control AGC, for example. This is so that the digital calibration word will be independent of the value of the gain delivered by the up/down counter of the automatic gain control in the course of the calibration phase.

Of course, it would in theory be possible to formulate the digital calibration word directly at the output of the delta-sigma modulator. Here again, for accuracy reasons it is preferable to formulate the digital calibration word by using samples of higher resolution. This is why the calibration means MCAL is preferably be situated between the comb filter CMF and the automatic gain control AGC.

Referring to FIG. 9, to perform the calibrations, the device DCAN includes at one end a multiplexer MXE. The multiplexer MXE has a first input connected to a calibration input terminal BEC for receiving the calibration signal SCAL. Furthermore, the multiplexer MXE has a second input which forms the input terminal BEN and receives, during normal operation (i.e., after calibration), the analog signals to be converted. The multiplexer MXE is controlled by a command signal SC (for example, a two-state logic signal) delivered by command means MCD of conventional structure known to those of skill in the art, which are not illustrated in detail here for simplicity.

The calibration means MCAL moreover comprises a multiplexer MX1 having an input EX1 connected to the output of the comb decimator filter CMF, a first output SX1, and a second output SX2. The multiplexer MX1 is controlled by a command signal SC1. The calibration means also includes subtraction means MST possessing a first input ES1 connected to the first output SX1 of the multiplexer MX1, a second input ES2, and an output SS2 which is connected to the input of the automatic gain control AGC.

The calibration means MCAL further comprises a memory means RG, for example a register. In the present example, 12 flip-flops are used and each stores one bit of the sample delivered by the filter CMF, although other suitable memory means known to those of skill in the art may also be used. The memory means RG is connected between the second output SX2 of the multiplexer MX1 and the second input ES2 of the subtraction means MST.

Finally, the command means MCD may connect the input EX1 of the multiplexer MX1 to its second output SX2 during the calibration phase to store in the memory means RG the digital calibration word corresponding to the constant analog calibration signal SCAL present at the input BEC of the analog-to-digital converter. Moreover, the command means connects the input EX1 of the multiplexer MX1 to its first output SX1 in the phase of normal operation of the converter, i.e., after calibration. Thus, in the normal operating phase, the content of the memory means RG, which is the calibration word, is subtracted from the samples delivered by the comb filter CMF corresponding to the analog signal to be converted and which are present on the input terminal BEN.

Figure 10:
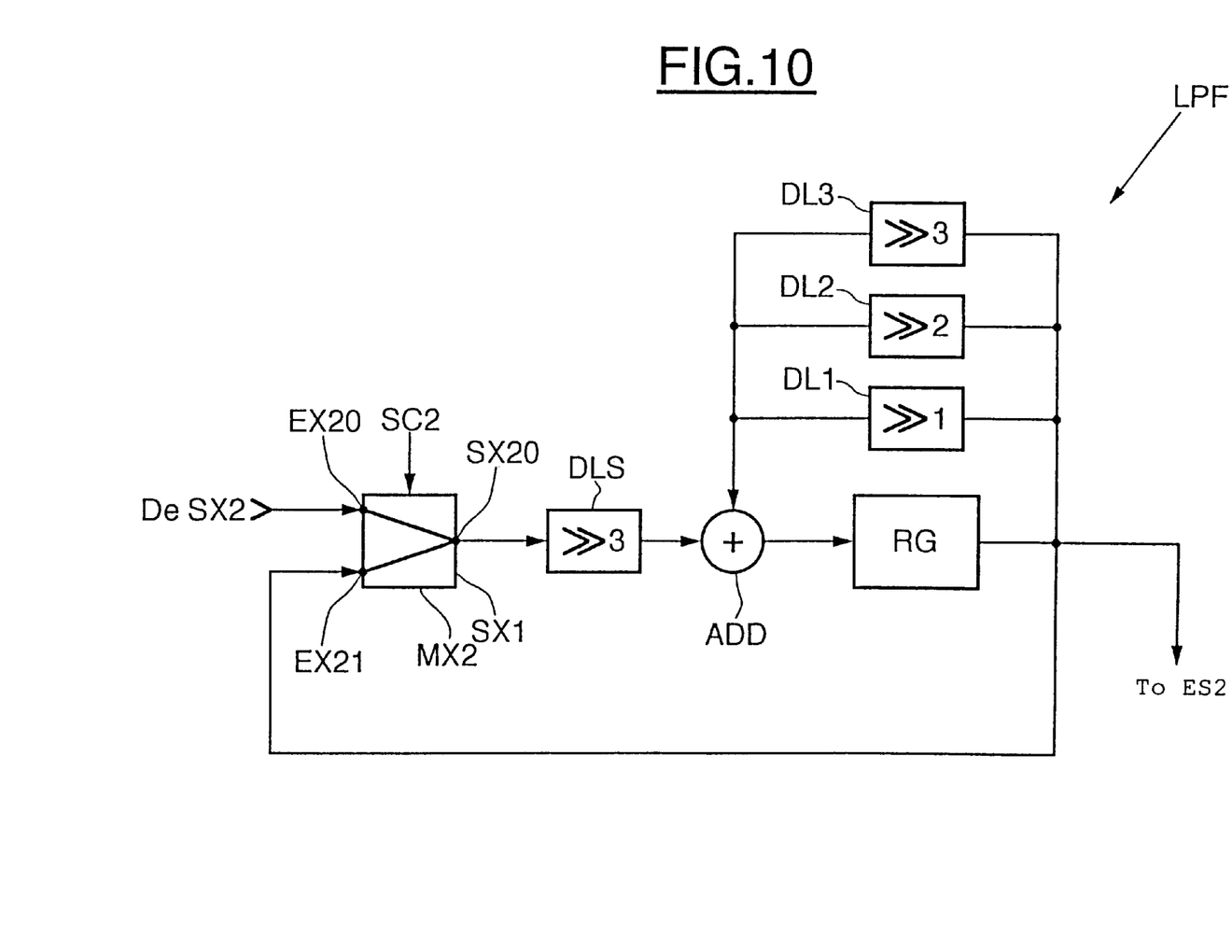
FIG. 10 is a schematic diagram of a part of the calibration means with which the converter of FIG. 9 is equipped.

It is particularly advantageous in certain applications to couple a low-pass filter to the calibration means to eliminate certain frequencies caused by noise which might disturb the calibration. In this case, a low-pass filter may be connected to the memory means during the calibration phase. An embodiment of such a low-pass filter LPF, which is relatively simple to implement, is shown in FIG. 10. The low-pass filter LPF is a first-order low-pass filter having a cut-off frequency equal to 0.021 multiplied by the intermediate sampling frequency (equal to 8Fs). The numerical equation for such a filter is defined by the formula:

$$RG = 7/8 RG + 1/8 SX2$$

where RG designates the content of the register RG, and SX2 designates the output value of the comb filter CMF.

The low-pass filter LPF includes three means for shifting bits leftward DL1, DL2, DL3, which are all connected between the output of the register RG and the input of the register RG by an adder ADD. Moreover, the means DL1 performs a leftward shift of 1 bit while the means DL2 performs a leftward shift of 2 bits and the means DL3 performs a leftward shift of 3 bits. Together, these three means DL1, DL2, DL3 make it possible to produce the coefficient 7/8th (which is equal to ½+¼+⅛). Furthermore, the filter LPF also includes an additional means DLS for shifting bits leftward. In this instance, the means DLS performs a leftward shift of 3 bits and is connected between the output of a multiplexer MX2 and the other input of the adder ADD. The means DLS makes it possible to produce the multiplier coefficient ⅛.

The multiplexer MX2 includes a first input EX20 connected to the output SX2 of the multiplexer MX1, as well as a second input EX21 which is connected to the output of the register RG. During the calibration phase, the command signal SC2 (e.g., a two-state logic signal) connects the input EX20 of the multiplexer MX2 to its output SX20 to take into account the output from the filter CMF. The system is allowed to converge for a certain time until the content of the register RG substantially stops varying, at which point the content is equal to the calibration word. During normal operation (i.e., once the calibration has been performed), the multiplexer MX2 is commanded by the signal SC2 to link its input EX21 to its output SX20. The content of the register RG then remains constant.

What is claimed is:

1. A method for converting an analog signal into a digital signal comprising:
   inputting the analog signal into an analog-to-digital converter of a delta-sigma type comprising a delta-sigma modulator and having an output sampling frequency;
   sampling the analog signal to provide an intermediate digital signal at an intermediate sampling frequency greater than the output sampling frequency; and
   performing an automatic gain control on the intermediate digital signal in the analog-to-digital converter at a location downstream of the delta-sigma modulator.

2. The method of claim 1 further comprising filtering the intermediate digital signal using a decimator filter prior to performing the automatic gain control.

3. The method of claim 2 further comprising:
   calibrating the analog-to-digital converter by inputting a constant analog calibration signal therein and formulating a digital calibration word at a calibration location of the analog-to-digital converter situated between the delta-sigma modulator and the location downstream of the delta-sigma modulator based upon digital samples provided at the calibration location; and
   subtracting the digital calibration word from each digital sample provided at the calibration location to form the intermediate digital signal.

4. The method of claim 3 wherein the calibration location is at an output of the comb decimator filter.

5. The method of claim 3 wherein calibrating comprises formulating the digital calibration word using a low-pass filter for filtering the digital samples provided at the calibration location.

6. A method for converting an analog signal into a digital signal comprising:
   inputting the analog signal into an analog-to-digital converter of a delta-sigma type comprising a delta-sigma modulator and having an output sampling frequency;
   sampling the analog signal to provide an intermediate digital signal at an intermediate sampling frequency greater than the output sampling frequency;
   filtering the intermediate digital signal using a decimator filter; and
   performing an automatic gain control on the intermediate digital signal in the analog-to-digital converter at a location downstream of the delta-sigma modulator.

7. The method of claim 6 further comprising:
   calibrating the analog-to-digital converter by inputting a constant analog calibration signal therein and formulating a digital calibration word at a calibration location of the analog-to-digital converter situated between the delta-sigma modulator and the location downstream of the delta-sigma modulator based upon digital samples provided at the calibration location; and subtracting the digital calibration word from each digital sample provided at the calibration location to form the intermediate digital signal.

8. The method of claim 7 wherein the calibration location is at an output of the decimator filter.

9. The method of claim 7 wherein calibrating comprises formulating the digital calibration word using a low-pass filter for filtering the digital samples provided at the calibration location.

10. A device for converting an analog signal into a digital signal:

an analog-to-digital converter of a delta-sigma type comprising a delta-sigma modulator and at least one output decimator filter; and an automatic gain control circuit connected between said delta-sigma modulator and said at least one output decimator filter.

11. The device of claim 10 wherein said analog-to-digital converter comprises a decimator filter connected between said delta-sigma modulator and said at least one output decimator filter; and wherein said automatic gain control circuit is connected between said decimator filter and said at least one output decimator filter.

12. The device of claim 11 wherein said delta-sigma modulator introduces an offset during conversion of the analog signal; and wherein the device further comprises a calibrator to account for the offset.

13. The device of claim 12 wherein said calibrator comprises:

a multiplexer having an input connected to an output of said decimator filter and first and second outputs;

a subtracter having a first input connected to the first output of said multiplexer, a second input, and an output connected to an input of said automatic gain control circuit;

a memory connected between the second output of said multiplexer and the second input of said subtractor; and a driver for connecting the input of said multiplexer to the second output of said multiplexer during a calibration phase to store in said memory a digital calibration word responsive to a constant analog calibration signal provided at an input of said analog-to-digital converter, and for connecting the input of said multiplexer to the first output of said multiplexer in a phase of normal operation of said analog-to-digital converter.

14. The device of claim 13 wherein said calibrator further comprises a low-pass filter for connection to said memory during the calibration phase.

15. The device of claim 14 wherein said memory has an input and an output; and wherein said low-pass filter comprises:

a first shifter for shifting bits leftward connected to the output of said memory;

an adder connected between said first shifter and the input of the memory; and a second shifter for shifting bits leftward connected between the second output of said multiplexer and said adder.

16. The device of claim 12 wherein said memory comprises a register.

17. A device for converting an analog signal into a digital signal:

an analog-to-digital converter of a delta-sigma type comprising a delta-sigma modulator and at least one output decimator filter;

a decimator filter connected between said delta-sigma modulator and said at least one output decimator filter; and an automatic gain control circuit connected between said decimator filter and said at least one output decimator filter.

18. The device of claim 16 wherein said delta-sigma modulator introduces an offset during conversion of the analog signal; and wherein the device further comprises a calibrator to account for the offset.

19. The device of claim 18 wherein said calibrator comprises:

a multiplexer having an input connected to an output of said decimator filter and first and second outputs, a subtractor having a first input connected to the first output of said multiplexer, a second input, and an output connected to an input of said automatic gain control circuit;

a memory connected between the second output of said multiplexer and the second input of said subtracter; and a driver for connecting the input of said multiplexer to the second output of said multiplexer during a calibration phase to store in said memory a digital calibration word responsive to a constant analog calibration signal provided at an input of said analog-to-digital converter, and for connecting the input of said multiplexer to the first output of said multiplexer in a phase of normal operation of said analog-to-digital converter.

20. The device of claim 19 wherein said calibrator further comprises a low-pass filter for connection to said memory during the calibration phase.

21. The device of claim 20 wherein said memory has an input and an output; and wherein said low-pass filter comprises:

a first shifter for shifting bits connected to the output of said memory;

an adder connected between said first shifter and the input of the memory; and a second shifter for shifting bits connected between the second output of said multiplexer and said adder.

22. The device of claim 21 wherein said first shifter and said second shifter shift bits leftward.

23. The device of claim 19 wherein said memory comprises a register.

\* \* \* \* \*